United States Patent

[11] 3,626,086

[72] Inventor Ulyss Ray Rubey
Denton, Tex.
[21] Appl. No. 32,576
[22] Filed Apr. 28, 1970
[45] Patented Dec. 7, 1971
[73] Assignee Computer Industries, Inc.
Sherman Oaks, Calif.

[54] WIRE-ROUTING SYSTEM
8 Claims, 4 Drawing Figs.

[52] U.S. Cl. 174/68.5, 29/626, 174/68 C, 174/70 R, 174/72 A, 317/101 CC
[51] Int. Cl. H05k 1/18
[50] Field of Search 174/68.5, 68 C, 72 A, 70 R, 70; 317/101 B, 101 A, 101 CC, 122, 120

[56] References Cited

UNITED STATES PATENTS

| | | | |
|---|---|---|---|
| 3,082,984 | 3/1963 | Larsson et al. | 174/72 A X |
| 3,321,571 | 5/1967 | Lynch | 174/72 A X |

FOREIGN PATENTS

| | | | |
|---|---|---|---|
| 1,224,204 | 2/1960 | France | 174/72 A |
| 972,773 | 10/1964 | Great Britain | 174/72 A |

*Primary Examiner*—Darrell L. Clay
*Attorney*—Jackson & Jones

ABSTRACT: An improved wire-routing system for use with reflow wiring machines is disclosed in which the system includes a single-sided printed circuit board having a plurality of wire land pads and integrated circuit land pads located thereon. Wire routing fixtures are also adapted to be positioned on the circuit board; each fixture having a plurality of longitudinally spaced guides positioned near adjacent land pads for receiving portions of the insulated wire as it is strung or routed from one wire land pad to another. Each of the guides extends upwardly on a slant to enable the wire to be directed downwardly flush with the base of the fixture when routed thereby so as not to interfere with subsequent wiring in that area. Power busses are also provided for connection to any desired integrated circuit land pad. The power busses are formed as flat strips and are positioned beneath the fixtures in such a manner that they also do not interfere with the wire-routing operation.

INVENTOR
U. RAY RUBEY
BY
Jackson & Jones
ATTORNEYS.

INVENTOR.
U. RAY RUBEY

BY

Jackson & Jones
ATTORNEYS.

WIRE-ROUTING SYSTEM

CROSS REFERENCE TO RELATED APPLICATIONS

The novel wire-routing system as set forth in the present application is an improvement to be used in conjunction with the basic wire-routing system as set forth in U.S. Pat. application Ser. No. 885,025 entitled "WIRE ROUTING SYSTEM" which was filed Dec. 15, 1969. The present wire-routing system may also be used with the method and apparatus described in U.S. Pat. application Ser. No. 885,077 entitled "-WIRE CUTTING METHOD AND APPARATUS FOR REFLOW WIRING MACHINES" which was filed Dec. 15, 1969.

BACKGROUND OF THE INVENTION

1. Field of the Invention

The present invention relates to reflow wire-routing systems for random interconnection of selected areas on printed circuit boards and more particularly to wire-routing systems that are adapted for utilization with numerically controlled reflow wiring machines.

2. Description of the Prior Art

Heretofore, printed circuit boards came in a variety of designs and configurations. A design extensively used today is the multiple layer printed circuit board module in which a plurality of printed circuit boards are stacked in layers and electrically interconnected by busses or the like which extend through punched or plated eyelets. Because of the complexities involved in the structure, such multilayered configurations do not easily lend themselves to automated production applications. Moreover, the plating process for the eyelets, which often involved gold plating, is quite expensive.

This complexity is greatly simplified with the advent of "Numerically Controlled" (NC) wiring systems which have eliminated the need for multilayer boards. One such NC wiring system used successfully utilizes a system for random interconnection of selected areas on a single-printed board by providing means for handling, locating and reflow soldering insulated wire to these selected areas on the printed circuit board. With such a process it is possible to produce almost any circuit from one basic board layout.

Basic components of such a system for routing and connecting insulated wire to the printed circuit board include a special reflow soldering capillary through which the insulated wire is passed, and an alternating-current power supply for pulse heating the capillary. A tip support system for applying a controlled force to the capillary during the soldering cycle; and a wire feed and support system are also included in the basic components.

In operation, the printed circuit board is positioned on a numerically controlled movable X—Y table. The capillary with insulated wire in place, is then brought into contact with a land area on the printed circuit board. The alternating-current power supply heats the capillary for a predetermined amount of time, which vaporizes the insulation on the wire and causes the solder on the printed circuit board to melt and flow around the exposed wire. After cooling, the capillary is raised from the board with the insulated wire passing through it. The printed circuit board is then moved by the table until the second desired land area is positioned under the capillary. During such movement, the first connection moves away from the capillary and the insulated wire, fed from the capillary, is directly routed between the two connections. When the second land area is positioned under the capillary, the solder connection step is then repeated.

This routing procedure is repeated until all of the desired interconnections have been made.

Although such a system is a vast improvement over prior production equipment, the system still suffers from various shortcomings which severely limit its utilization.

A major problem encountered is that when a complex circuit is produced by the NC programmed system on a printed circuit board, the stringing of the wire is routed and rerouted over the various land areas from many different angles from all over the board. Such a scrambled hodgepodge of wires creates a veritable "rat's nest" of wires which is very hard to follow or unscramble. The problem is especially acute when a design change necessitates a rerouting of the wire after the circuit has been produced. With such a system it is virtually impossible to locate the desired connections to change them.

Moreover, the dual in-line packages used in such systems are located on the opposite sides of the circuit board on which the wire routing is located. As a result, these packages must be mounted on plugs equipped with long rods which extend through eyelets or plated passages for connection with the land pads. Moreover, these connections are made in such a manner that they interfere with any visual inspection of the wire routing. In case of malfunction, therefore, the plugs must be disconnected and removed, which, of course, is arduous and undesirable. As a result, it is virtually impossible to repair any malfunctions occurring on the circuit board, and as a general rule, when a malfunction occurs, the entire board is discarded.

A vast improvement over the prior art systems has been made by the wire-routing system described in the above-mentioned U.S. Pat. application, Ser. No. 885,025, entitled "-WIRE ROUTING SYSTEM". In such a system a single-layered printed circuit board is provided having a plurality of parallel rows of wire land areas having a plurality of wire guide fixtures located between said rows. Each of the fixtures included longitudinally spaced guide posts having hooked means on the upper portions thereof for receiving portions of insulated wire as it is routed or strung from one land area to another. With such a system, after an initial connection is made, the printed circuit board being mounted on a movable X–Y table is moved in such a manner with respect to the capillary that the insulated wire is strung around the post means located adjacent to the first connection and moved longitudinally along the fixture until the wire reaches the area of the second desired connection. The numerically controlled table then moves the printed circuit board in such a manner that the wire is strung around the second post means which is adjacent to the second desired lane area. The board is then moved slightly to position the capillary over the second land area for reflow soldering the wire thereto. The above procedure is then repeated from the remaining interconnections with the insulated wire being strung or routed around the various guide posts in straight line relationships, i.e., X–Y directions, until all the desired interconnections have been made. With such an improved system the routing of the insulated wire over the printed circuit board is greatly simplified in order to make the routing repeatable and repairable. As a result the scrambled hodgepodge of wires produced by the prior art wiring systems is eliminated.

Although such a wire routing system has greatly simplified the wiring procedure of printed circuit boards, the present invention provides an improved system which further simplifies the wire routing to enable the programming for such a system to be accomplished more efficiently.

In the system described in U.S. Pat. application Ser. No. 885,025, because of the vertical post means and the hooked portions located thereon, the capillary had to be lowered at various times in order to permit the insulated wire to be positioned under the hooked portions. After the insulated wire is secured to the hooked portions, the capillary must then be raised in order to permit further travel along the printed circuit board without interference. Moreover, because the hooked portions extend laterally outwardly from the fixtures, the capillary and the insulated wire had to be routed on the opposite side of the fixtures with respect to the desired connection point as it traveled to the connection point.

The present invention has simplified such a procedure by providing slanted guide posts which enable the capillary and insulated wire to travel along the centerline of the guide fixtures until it reaches the desired X-axis coordinate. The capillary is then relatively movable in either Y-direction for connection with any desired land area.

Because such guide means are slanted, the insulated wire is directed downwardly flush with the base of the fixture as the insulated wire passes thereby. Such a procedure enables the capillary to traverse the printed circuit board at a single attitude and is only lowered or raised during the soldering operations. As a result, the other raising and lowering steps are eliminated and the programming of the travel of the capillary and the printed circuit board is greatly simplified.

Moreover, in the above-mentioned system described in U.S. application, Ser. No. 885,025, vertically extending power busses are positioned between the parallel rows of wire guide fixtures. In such a system, when it is necessary to traverse from one row to another, the capillary has to be raised to permit such traversal. The present invention obviates this procedure by providing power busses in the form of flat strips positioned beneath the fixtures so as not to interfere with the wire-routing operation.

A more detailed description of the system, along with its advantages is described in the following Summary of the Invention and Description of the Preferred Embodiment.

SUMMARY OF THE INVENTION

The present invention provides an improved wire-routing system for use with a reflow wiring machine that greatly simplifies the stringing or routing of insulated wire over a printed circuit board in order to make the routing repeatable and repairable on visual inspection.

The improved wire-routing system includes a single-sided printed circuit board having a plurality of wire land pads and integrated circuit land pads located thereon. The wire land pads and the integrated circuit land pads are arranged in parallel rows with each wire land pad electrically communicating with a respective integrated circuit land pad. Wire routing fixtures are also adapted to be positioned on the circuit board between the parallel rows. Each fixture includes a plurality of longitudinally spaced guides positioned near adjacent land pads for receiving portions of the insulated wire as it is strung or routed from one wire land pad to another. Each of the guides extends upwardly on a slant to enable the wire to be directed downwardly flush with the base of the fixture when routed thereby so as not to interfere with subsequent wiring in that area. Such an operation also permits the capillary or wire-feeding head to travel at the same attitude without raising or lowering except to form a solder joint. The integrated circuit land pads are oriented in parallel rows on both sides of the fixtures to permit dual in-line packages having a plurality of downwardly extending legs to be reflow soldered thereto. Power busses are also provided for connection to any desired integrated circuit land pad. The power busses are formed as flat strips and are positioned beneath the fixtures in such a manner that they also do no interfere with the wire-routing operation.

An important advantage of the novel wire-routing system is that the wire stringing and soldering is accomplished in such a manner that all of the solder joints and the routing are exposed at all times for inspection and repair.

Another important advantage of the present invention is that such a system particularly lends itself to automated NC processes and equipment. With such a system, the positions of all the interconnections are known, the wire routes are greatly simplified, and rerouting can be easily accomplished.

A particular advantage of the improved wire-routing fixtures is that the travel of the capillary or head is greatly simplified to enable the routing to be done more rapidly and the routing programming to be accomplished more efficiently.

Still another important advantage of the improved wire-routing system is that the positioning of the power busses and the flush positioning of the wires enable the wire routing to be accomplished smoothly with a minimum of interference.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings.

DESCRIPTION OF THE PREFERRED EMBODIMENT

Figure 1:
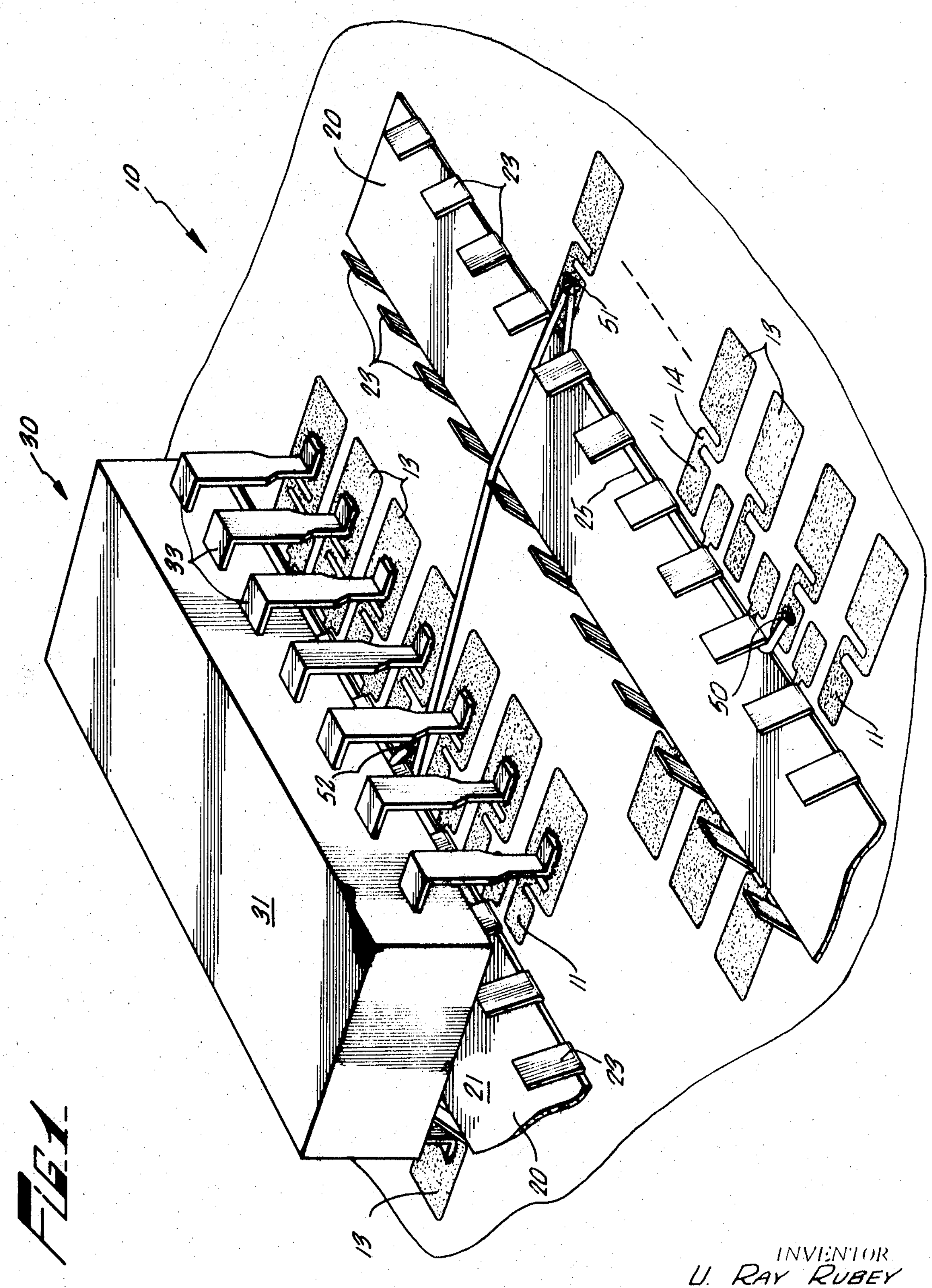
FIG. 1 is a perspective view of a printed circuit board having novel wire-routing means located thereon.

Referring now to the drawings, FIG. 1 shows a circuit board, generally indicated by arrow 10, having a printed circuit pattern located thereon. The printed circuit pattern consists of a plurality of wire land areas or pads 11 and integrated circuit land pads 13 arranged in groups of parallel rows. Each group comprises a pair of outer rows of integrated circuit land pads and a single row of wire land pads 11 positioned adjacent one of the rows. The wire land pads 11 of each row are alternately connected to the integrated circuit land pads 13 on both sides thereof by means of printed connections 14. Each of the land pads 11 and 13 is formed with a quantity of reflow soldering material for making solder connections.

A space is provided on the printed circuit board 10 between each row of wire land pads 11 and the other of the rows of the integrated circuit land pads 13 for receiving a wire guide fixture 20. Each of the fixtures 20 includes an elongated flat base 21 having a plurality of longitudinally spaced guides or posts 23 formed on both lateral sides thereof. Each guide 23 extends upwardly from the base 21 on a slant, with each guide 23 positioned between a pair of adjacent land pads. A quantity of insulated wire 25 is routed or strung onto the printed circuit board for interconnecting the various wire land pads 11, the operation of which will be described in greater detail hereinafter.

Dual in-line packages, such as the one generally indicated by arrow 30, are provided for connection to the circuit board 10. Each package 30 includes a main body 31 having a plurality of legs 33 extending downwardly from both sides thereof to be reflow soldered to the registering integrated circuit land pads 13. Each dual in-line package 30 contains a desired circuit formed within the main body 31 with the legs 33 forming the electrical outlets. The wire guide fixtures 20 and the dual in-line packages 30 are dimensioned in such a manner that the dual in-line package 30 extends over the fixtures 20 to permit visual inspection of the wire routing positioned below.

Figure 2:
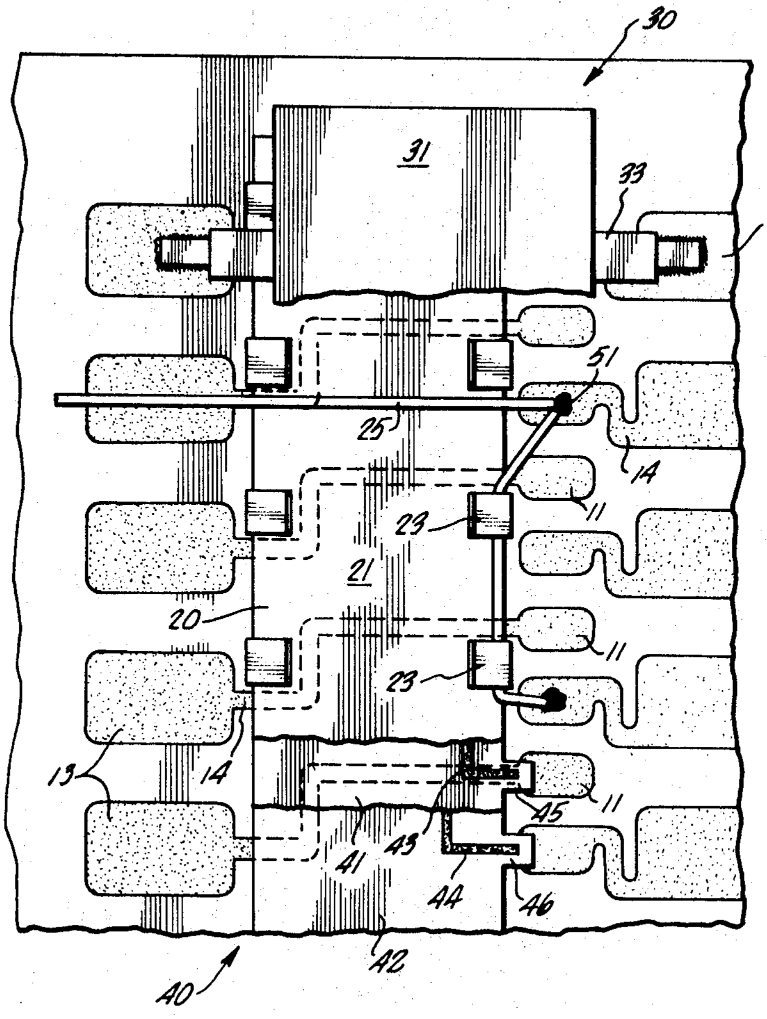
FIG. 2 is a fragmentary elevational view of the printed circuit board of the present invention with a portion of the wire guide fixture removed to more clearly illustrate the novel power bus arrangement.
Figure 3:
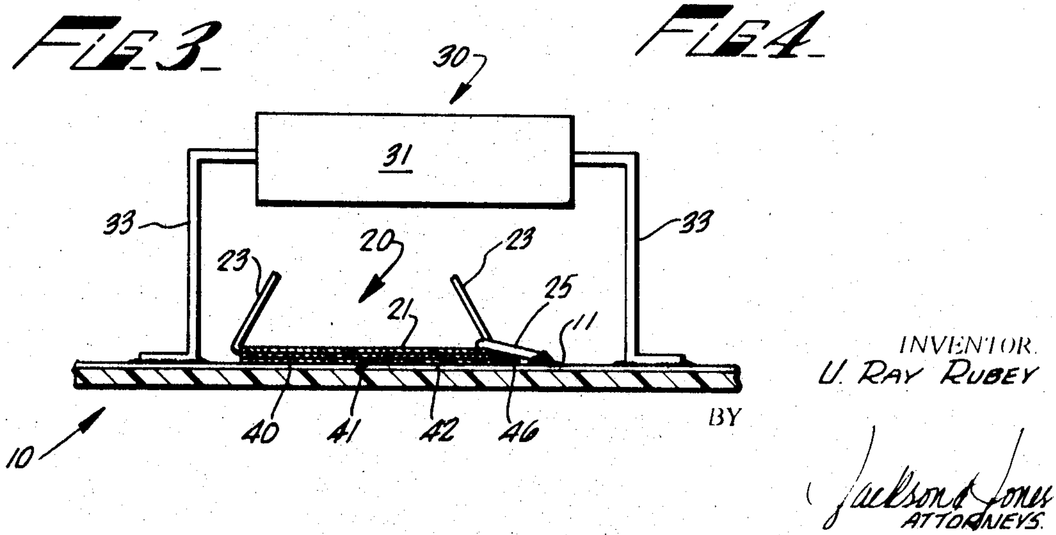
FIG. 3 is a sectional view of the printed circuit board taken along lines 3—3 of FIG. 2.

FIGS. 2 and 3 more clearly illustrate a power bus 40 in the form of a pair of overlaying strips 41 and 42 adapted to be positioned beneath the wire guide fixtures 20. The strips 41 and 42 have ground and voltage lines 43 and 44 respectively etched thereon with each of the lines having branches terminating at tabs 45 and 46 extending outwardly from the strips for connection to any desired wire land pad 11. Each of the strips 41 and 42 is preferably bonded to the adjacent surfaces by means of a Mylar adhesive, although other bonding means may also be used. In like manner, the fixtures 20 are mounted over the power busses 40 and bonded in a similar manner with the adhesive bonding also functioning as insulating means therebetween.

In assembling the printed circuit board, the circuit board 10 is adapted to be placed on a conventional numerically controlled X–Y table (not shown) which is movable to position any area of the board 10 directly beneath a capillary (also not shown). As mentioned previously, the conventional capillary functions to handle and feed the insulated wire onto the circuit board. In making the initial connection at point 50, after the desired wire land pad 11 is positioned under the capillary, the capillary is lowered to bring the insulated wire 25 into contact with the desired land pad 11. An alternating current power supply then heats the capillary for a predetermined amount of time to vaporize the insulation on the wire 25 and cause the solder material on the land pad 11 to melt and flow around the exposed wire 25. After the solder joint at 50 is cooled for a moment, the capillary is raised from the board 10 with the insulated wire 25 passing through it. The table is then moved a short distance in a Y-direction to permit the capillary to string the wire 25 around an adjacent guide 23. Thereafter, assuming the second connection point 51 to be in the same row, the printed circuit board 10 is moved laterally in the X-direction to permit the capillary to travel along the centerline of fixture 20. After the capillary reaches the desired X-coordinate for the second connection point 51, the board is moved a short distance in the Y-direction to enable the capillary to move from the centerline of the fixture 20 to a position directly above the second desired wire land pad 11. During such a movement the wire 25 is again strung around an adjacent wire guide 23. Afterwhich the capillary is lowered and heated to form the second solder joint in the manner previously described. After the second joint is made, assuming the third connection 53 to be in a different group of rows, the circuit board 10 is preferably moved in the Y-direction until the capillary extends over the wire guide fixture 20 of the desired group. The board is then moved in the X-direction until the capillary reaches the desired X-coordinate for the third connection point 53. Afterwhich the circuit board 10 is moved a short distance in the Y-direction until the third connection point 53 is directly beneath the capillary. The capillary is then lowered to form the solder connection 53, as previously described. In all of the above change of directions, the wire 25 is strung around an adjacent guide 23.

As shown by the operation, the movement of the circuit board 10 and the raising and lowering of the capillary is greatly simplified. When the board is moving in the X-direction the capillary travels along the centerline of the respective wire guide fixture 20 and when the desired X-coordinate is reached, the board 10 can move in either Y-direction for connection to any desired land pad 11 on that coordinate. Moreover, because the wire guides 23 are slanted, the movement of the board 10 as it routes the wire 25 around the respective guide 23 causes the wire 25 to slide downwardly to a position flush with the base 25 so as not to interfere with subsequent wiring in that area. As a result, the capillary need not be raised to traverse such areas. Moreover, since the power busses 40 do not extend vertically upward, as previously described in the related application, they also do no interfere with the traversal of the capillary. As can be seen, the greatly simplified travel of the circuit board and the capillary enables the programming of the circuit board travel in the X–Y direction and the travel of the capillary in the Z-direction to be accomplished more efficiently.

As can be seen, the entire routing can be easily programmed on a numerically controlled apparatus. Moreover, if a desired change in the circuitry is necessary, this can easily be effectuated by simple changes in the NC reprogramming.

As a result, a greatly simplified wire routing system is provided on a novel printed circuit board to enable the wire routing to be repeatable and repairable on visual inspection.

The wire guide fixtures may be formed out of metal with a protective coating of plastic formed thereon, or the entire guide member may be formed from plastic.

Figure 4:
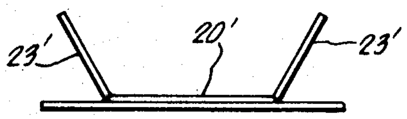
FIG. 4 is a sectional view of a second embodiment of the wire guide fixture.

It should be noted that various modifications can be made to the apparatus while still remaining within the purview of the following claims. One such modification is shown in FIG. 4 wherein the guides 23′ of the fixtures 20′ are slanted at an angle opposite from that shown in the embodiment of FIG. 1.

I claim:

1. A wire guided printed circuit comprising a printed circuit board having wire land areas disposed on one side thereof for receiving and forming electrical joints with portions of a wire registering with selected wire land areas, said wire land areas arranged in a given set of coordinates; and means disposed on the one side of said printed circuit board for guiding the lengths of the wire extending between the electrical joints at the selected areas in the directions of said given coordinates, said wire guide means further comprising at least one baseplate positioned between said wire land areas in the direction of one of said given coordinates, each base plate having a plurality of posts extending upwardly from said baseplate for receiving the lengths of wire, said posts being oriented on a slant with respect to said base to enable the wire routed thereon to be automatically directed downwardly flush with said baseplate and be secured in that position after the electrical connections have been made.

2. The invention of claim 1 wherein the wire land areas comprise a plurality of spaced wire-receiving land areas arranged in a row along one of said given coordinates, the baseplate is disposed adjacent and parallel to said row of land areas with each of the posts being positioned adjacent a wire land area to enable the wire to be routed along the given coordinates.

3. The invention of claim 2 further including a plurality of integrated circuit land pads disposed on one side of said printed circuit board with each integrated circuit land pad being electrically connected to a registered wire land area.

4. The invention of claim 3 wherein said integrated circuit land pads are arranged in a pair of parallel rows, each row being on one side of said row of wire land areas.

5. The invention of claim 4 further comprising a power bus in the form of a flat strip being positioned directly below each row of slanted post means, each strip having voltage and ground lines formed thereon and terminating in a plurality of laterally extending tabs which extend over selected wire land pads electrically connecting said voltage and ground lines thereto.

6. The invention of claim 4 further comprising a power bus in the form of a pair of flat strips being superimposed directly below each row of slanted post means, the strips respectively having voltage and ground lines formed thereon and terminating in a plurality of laterally extending tabs which extend over selected wire land pads electrically connecting said voltage and ground lines thereto.

7. The invention of claim 1 wherein the wire land areas comprise a plurality of spaced wire-receiving land areas arranged in a plurality of rows parallel to one of said given coordinates, said wire guide further comprising a plurality of base plates, each baseplate is disposed adjacent and parallel to a respective row of land areas with each of the posts being positioned adjacent a wire land area to enable the wire to be routed along the given coordinates.

8. The invention of claim 7 wherein the given coordinates are perpendicular with each other.

* * * * *